(12) United States Patent
Lu et al.

(10) Patent No.: US 11,363,732 B2
(45) Date of Patent: Jun. 14, 2022

(54) ELECTRONIC DEVICE AND WATERPROOF STRUCTURE FOR ELECTRONIC DEVICE

(71) Applicant: Harman Becker Automotive Systems GmbH, Karlsbad (DE)

(72) Inventors: Haifeng Lu, Shanghai (CN); Ying Zhang, Suzhou (CN); Huobing Huang, Shanghai (CN); Meiqi Wang, Suzhou (CN)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 17/024,175

(22) Filed: Sep. 17, 2020

(65) Prior Publication Data
US 2021/0092857 A1    Mar. 25, 2021

(30) Foreign Application Priority Data
Sep. 19, 2019 (CN) .......................... 201921567799.7

(51) Int. Cl.
*H05K 5/06* (2006.01)
(52) U.S. Cl.
CPC .................... *H05K 5/069* (2013.01)
(58) Field of Classification Search
CPC ...................................................... H05K 5/069
See application file for complete search history.

(56) References Cited

U.S. PATENT DOCUMENTS

| | | | |
|---|---|---|---|
| 2018/0109027 A1* | 4/2018 | Kaneko | H05K 5/0069 |
| 2019/0281718 A1* | 9/2019 | Bessho | H02G 3/16 |
| 2019/0373750 A1* | 12/2019 | Omote | H05K 5/061 |
| 2019/0380220 A1* | 12/2019 | Matsuda | H05K 5/0213 |
| 2020/0328554 A1* | 10/2020 | Asano | H01R 13/5202 |

* cited by examiner

*Primary Examiner* — Hung V Ngo
(74) *Attorney, Agent, or Firm* — McCoy Russell LLP (57) ABSTRACT

Disclosed are an electronic device and a waterproof structure for the electronic device. The waterproof structure for the electronic device includes: an outer housing having a housing opening; and an electronic device housing at least partially mounted in the outer housing through the housing opening, wherein the electronic device housing has an electronic device housing surface, the housing opening has an opening surface opposite to the electronic device housing surface, and the electronic device housing surface and the opening surface are spaced apart to define a gap therebetween, and wherein one of the electronic device housing surface and the opening surface defines a longitudinally extending groove, and an opening of the groove is orientated toward the other one of the electronic device housing surface and the opening surface.

20 Claims, 8 Drawing Sheets

ELECTRONIC DEVICE AND WATERPROOF STRUCTURE FOR ELECTRONIC DEVICE

CROSS REFERENCE TO RELATED APPLICATIONS

The present application claims priority to Chinese Utility Model Application No. 201921567799.7, entitled "ELECTRONIC DEVICE AND WATERPROOF STRUCTURE FOR ELECTRONIC DEVICE", and filed on Sep. 19, 2019. The entire contents of the above-listed application is hereby incorporated by reference for all purposes.

TECHNICAL FIELD

The present disclosure relates to an electronic device and a waterproof structure for the electronic device.

BACKGROUND ART

In the field of electronic products, it is generally necessary for an electronic product to have certain waterproof capability to provide waterproof protection for internal electronics. The waterproof capability of the electronic product is usually achieved through the airtightness of a housing and a sealing ring, etc. However, in some electronic products, a gap may be reserved, for example, between a connector of a car power amplifier and its radiator housing, due to some reasons (such as process or design reasons). Due to the existence of the gap, water can easily enter the electronic product from the gap, thereby adversely affecting the internal electronics.

Therefore, it is desirable that the electronic product can achieve certain waterproof capability in the presence of the gap.

SUMMARY OF THE DISCLOSURE

The purpose of the present disclosure is to provide a waterproof structure for an electronic device, which can achieve certain waterproof capability when there is a gap in an electronic product.

According to one aspect of the present disclosure, a waterproof structure for an electronic device is provided, which includes:

an outer housing having a housing opening; and an electronic device housing at least partially mounted in the outer housing through the housing opening, wherein the electronic device housing has an electronic device housing surface, the housing opening has an opening surface opposite to the electronic device housing surface, and the electronic device housing surface and the opening surface are spaced apart to define a gap therebetween, and wherein one of the electronic device housing surface and the opening surface defines a longitudinally extending groove, and an opening of the groove is orientated toward the other one of the electronic device housing surface and the opening surface.

Optionally, the electronic device housing surface is an upper surface of the electronic device housing, and the opening surface is an opening upper surface of the housing opening.

Optionally, the groove is formed in the opening surface and extends along a longitudinal direction of the opening surface, and an opening of the groove is orientated toward the electronic device housing surface.

Optionally, the opening surface includes a first plane portion and a second plane portion, and the groove is formed between the first plane portion and the second plane portion.

Optionally, the first plane portion and the second plane portion are inclined with respect to the electronic device housing surface, so that a distance between an outer end of the opening surface and the electronic device housing surface is smaller than a distance between an inner end of the opening surface and the electronic device housing surface.

Optionally, the first plane portion and the second plane portion are in a plane that is inclined with respect to the electronic device housing surface.

Optionally, the first plane portion and the second plane portion are in a plane that is parallel to the electronic device housing surface.

Optionally, a cross-sectional shape of the groove is a square, a rectangle, or a trapezoid with rounded corners.

Optionally, a cross-sectional shape of the groove is a part of a circle or an ellipse.

Optionally, the electronic device is a vehicle-mounted power amplifier, the electronic device housing is a connector housing of the vehicle-mounted power amplifier, and the connector housing has a connector opening, which is exposed to an external environment through the housing opening.

Optionally, the groove is one groove or two or more grooves that are parallel and spaced apart from each other.

Optionally, a dimension of the gap is between 1 mm and 5 mm, and a cross-sectional dimension of the groove is between 1 mm and 5 mm.

Optionally, an inclination angle of the first plane portion and the second plane portion with respect to the electronic device housing surface is between 5 degrees and 15 degrees.

Optionally, a part of the electronic device housing is exposed to an external environment through the opening.

Optionally, the groove extends longitudinally over an entire length of the gap.

According to another aspect of the present disclosure, an electronic device including the above-mentioned waterproof structure is provided.

DETAILED DESCRIPTION

Embodiments of the present disclosure will be described in detail below. Examples of the embodiments are shown in the accompanying drawings, where the same or similar reference numerals always indicate the same or similar elements or elements with the same or similar functions. The embodiments described below with reference to the accompanying drawings are illustrative, which are only used to explain the present disclosure, and cannot be understood as a limitation to the present disclosure.

Unless otherwise defined, the technical terms or scientific terms used here should be the ordinary meanings understood by those of ordinary skill in the field of the present disclosure. In the description of the present disclosure, it should be understood that an orientation or positional relationship indicated by the terms "center," "longitudinal," "lateral," "upper," "lower," "front," "rear," "left," "right," "vertical," "horizontal," "top," "bottom," "inner," "outer," etc. is an orientation or positional relationship shown based on the accompanying drawings, is only for the convenience of describing the present disclosure and simplifying the description, rather than indicating or implying that a device or element referred to must have a specific orientation or be constructed and operated in a specific orientation, and therefore cannot be understood as a limitation to the present disclosure. In addition, the terms "first" and "second" are only used for descriptive purposes, and cannot be understood as indicating or implying relative importance.

Figure 1A:
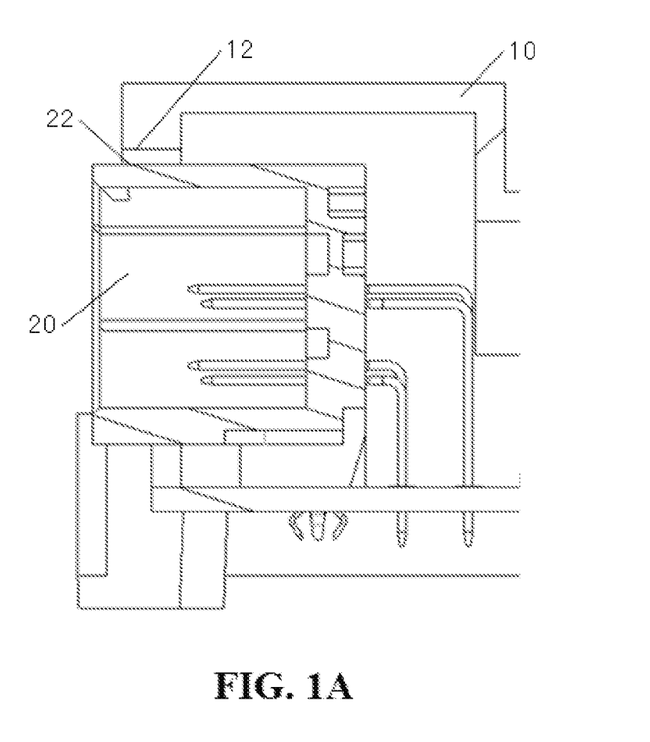
FIG. 1A and FIG. 1B show a mounting structure of a car power amplifier connector of a previous example.
Figure 1B:
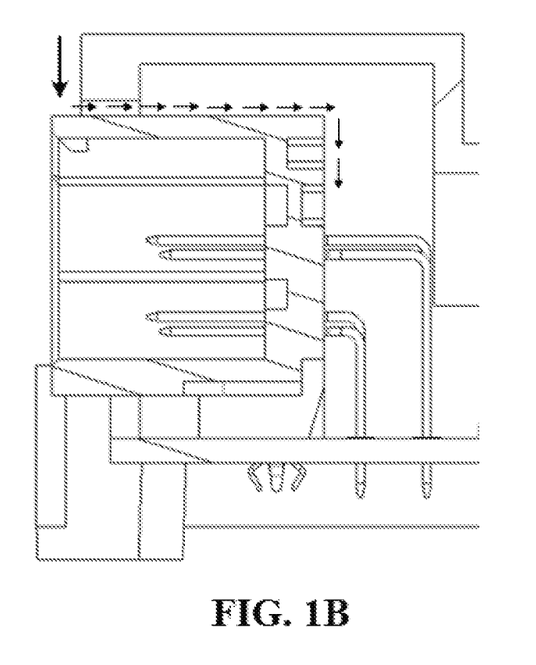

FIG. 1A and FIG. 1B show a mounting structure of a car power amplifier connector. As shown in the figures, an accommodating space is formed in outer housing 10 (e.g., housing of a car power amplifier), and the accommodating space communicates with an external environment through a housing opening of the outer housing (the housing opening in FIG. 1A is on the left side of outer housing 10). Car power amplifier connector 20 is mounted in the accommodating space through the housing opening, and the connector opening of car power amplifier connector 20 is exposed to the external environment through the housing opening of the outer housing for connecting with a corresponding connector. Car power amplifier connector 20 has connector housing upper surface 22, and the housing opening of outer housing 10 has opening upper surface 12 above connector housing upper surface 22 and opposite to the connector housing upper surface. For example, due to process or design reasons, opening upper surface 12 and connector housing upper surface 22 are spaced apart from each other, and form a gap therebetween.

As shown in FIG. 1B, when there is water dripping or splashing as shown by, for example, the big arrow in the figure, the dripping or splashing water will enter or seep inside the car power amplifier housing through the gap between connector housing upper surface 22 and opening upper surface 12 as shown by the small arrow in FIG. 1B, which may degrade the electronics and circuits of the car power amplifier.

Figure 2:
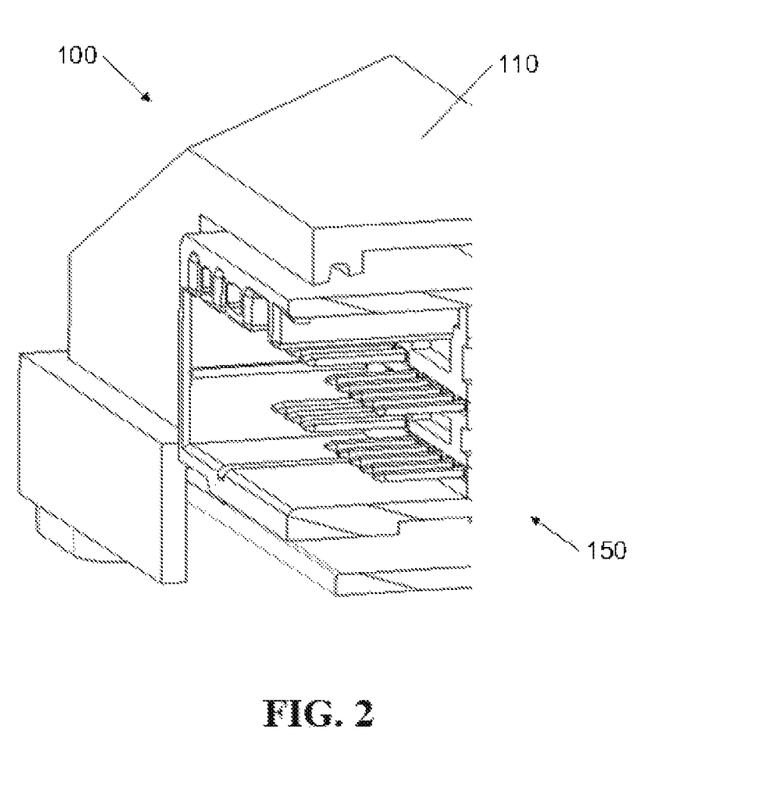
FIG. 2 shows a perspective view of a waterproof structure according to an exemplary embodiment of the present disclosure.
Figure 3:
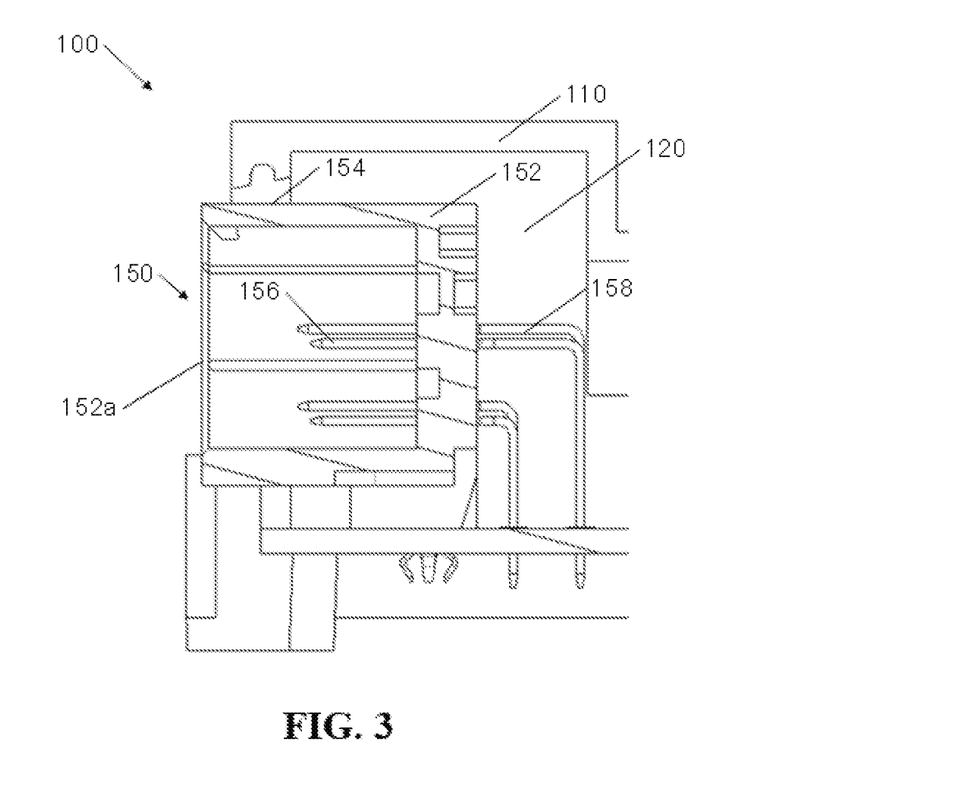
FIG. 3 shows a cross-sectional view of the waterproof structure of FIG. 2.

FIG. 2, FIG. 3 and FIGS. 4A-4B show a waterproof structure 100 according to an exemplary embodiment of the present disclosure. As shown in FIGS. 2-3, waterproof structure 100 includes electronic device (e.g., a car power amplifier connector) 150 and outer housing (e.g., a car power amplifier housing) 110. Accommodating space 120 is formed in outer housing 110, and accommodating space 120 communicates with the external environment through a housing opening of the outer housing. Electronic device 150 is mounted in accommodating space 120 through the housing opening. A part of electronic device 150 is exposed to the external environment through the housing opening.

In the exemplary embodiment shown in FIGS. 2-3, electronic device 150 is a car power amplifier connector, and the electronic device includes electronic device housing (connector housing) 152 and pins 156 provided inside electronic device housing 152. Pins 156 are provided on a rear wall of electronic device housing 152 and are electrically connected with leads 158 through the rear wall of electronic device housing 152, and leads 158 are therefore electrically connected with internal electronics of the car power amplifier. Electronic device housing 152 defines electronic device opening (connector opening) 152a. Electronic device opening 152a is exposed to the external environment through the housing opening of the outer housing for connecting with a corresponding connector. Those skilled in the art can understand that, although not shown, the power amplifier connector may have electronic components or even electronic chips. In one example, a size of the electronic device opening 152a is smaller than the housing opening based on a size of the electronic device housing 152.

As shown in the figure, electronic device (car power amplifier connector) 150 has electronic device housing 152, electronic device housing 152 has electronic device housing upper surface 154, and the housing opening of outer housing 110 has an opening upper surface over electronic device housing upper surface 154 and opposite to electronic device housing upper surface 154. For example, due to process or design reasons, the opening upper surface and electronic device housing upper surface 154 are spaced apart, and form a gap therebetween.

Figure 4A:
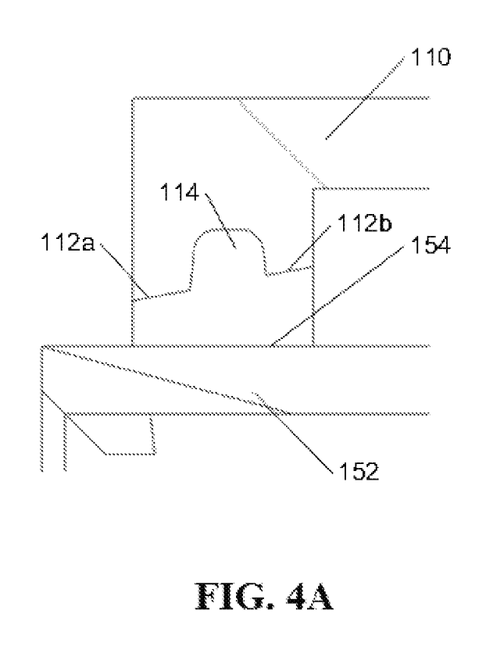
FIGS. 4A-4B show partially enlarged views of the waterproof structure of FIG. 3.

As shown in FIGS. 2, 3, and 4A, the opening upper surface of outer housing 110 is inclined, and is provided with a groove extending along the longitudinal direction (which is perpendicular to the direction of water flow illustrated in FIG. 1B) of the housing upper surface. As clearly shown in FIG. 4A, in the cross-sectional view of FIG. 4A, the opening upper surface includes plane portions 112a and 112b, as well as groove 114 between plane portions 112a and 112b. The plane on which plane portions 112a and 112b are located is inclined to electronic device housing upper surface 154, so that the distance between the outer end of plane portion 112a (the left end of FIG. 4A) and electronic device housing upper surface 154 is the smallest, and the distance between the inner end of plane portion 112b (the right end of FIG. 4A) and electronic device housing upper surface 154 is the largest.

Said another way, the first plane portion 112a may be gradually inclined such that a distance between the outer housing 110 and the electronic device housing upper surface 154 gradually increases in a direction away from the ambient environment. The second plane portion 112b may also be gradually inclined such that a distance between the outer housing 110 and the electronic device housing upper surface 154 gradually increases in a direction away from the ambient environment. In one example, a minimum distance measured at the second plane portion 112b between the outer housing and the electronic device housing upper surface 154 is greater than a maximum distance measured at the first plane portion 112a. The groove 114, which is arranged between the first plane portion 112a and the second plane portion 112b, comprises a U-shape, wherein the groove acutely increases the distance between the outer housing 110 and the electronic device housing upper surface 154.

Figure 4B:
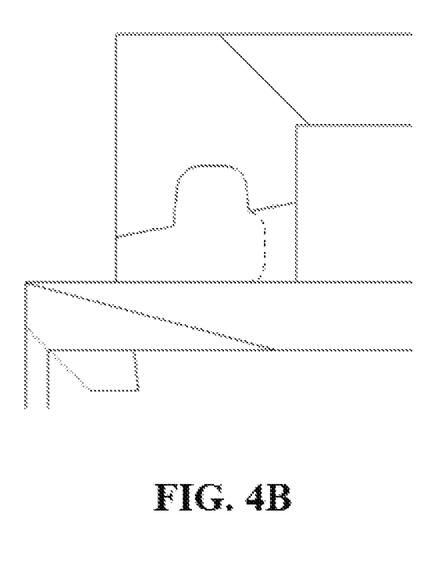

When water drips or splashes, the water seeps or enters into the gap between the opening upper surface and electronic device housing upper surface 154. Due to the Coanda Effect or the wall attachment effect, the water seeps or enters into water filling groove 114 of the gap and forms a water front surface as shown by, for example, the dotted line in FIG. 4B. Due to the effect of water surface tension and other factors, the water front surface prevents water from further entering the gap, thereby preventing water from further entering outer housing 110. Those skilled in the art can understand that the water front surface in FIG. 4B is illustrative, and in actual use, depending on the actual situation, various shapes of water front surfaces will be produced. Due to the inclination of groove 114 and the opening upper surface, the shape of the formed water front surface can prevent water from further entering outer housing 110. In one example, the waterproof structure of the present disclosure can provide waterproof performance of the IPX2 level.

Figure 5:
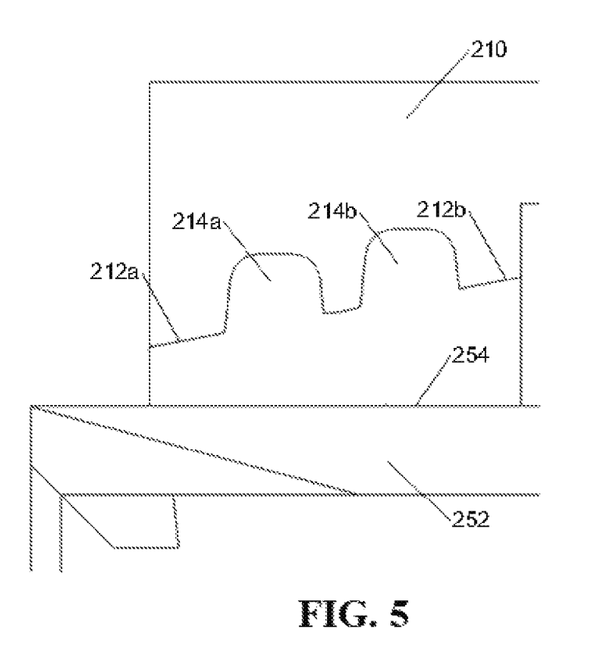
FIG. 5 and FIG. 6 show optional embodiments according to the present disclosure.
Figure 6:
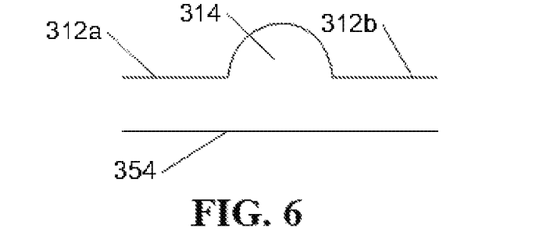

FIG. 5 and FIG. 6 show further embodiments according to the present disclosure. A waterproof structure shown in FIG. 5 is basically similar to that in FIG. 4, except that the waterproof structure in FIG. 5 includes two grooves. The waterproof structure shown in FIG. 5 includes electronic device housing 252 and outer housing 210. Electronic device housing 252 includes electronic device housing upper surface 254, and outer housing 210 includes a housing opening. An opening upper surface of the housing opening includes plane portions 212a and 212b, as well as two grooves 214a and 214b that are spaced apart from each other between plane portions 212a and 212b. The plane on which plane portions 212a and 212b are located is inclined to electronic device housing upper surface 254.

In the example of FIG. 5, the first groove 214a and the second groove 214b are substantially identical in shape and size. Due to the inclination of the plane portions 212a and 212b, the second groove 214b is higher than the first groove 214a. In one example, the first groove 214a and the second groove 214b may be in direct contact with one another such that a trailing edge of the first groove 214a is touching a leading edge of the second groove 214b. As another example, such as in the embodiment of illustrated in FIG. 5, a gap, such as a third plane portion, may be arranged between the first groove 214a and the second groove 214b.

A waterproof structure shown in FIG. 6 is similar to that shown in FIG. 4, and an opening upper surface thereof includes plane portions 312a and 312b, as well as groove 314 between plane portions 312a and 312b. The difference is that plane portions 312a and 312b are parallel to electronic device housing upper surface 354, but not inclined to electronic device housing upper surface 354. Since plane portions 312a and 312b of the waterproof structure shown in FIG. 6 are parallel to electronic device housing upper surface 354, the waterproof effect is slightly reduced relative to the embodiments shown in FIGS. 2, 3, 4A and 4B. However, in one example, a manufacture of the embodiment of FIG. 6 may be more simple than the manufacture of the embodiments of FIGS. 2, 3, 4A, and 4B. In one example, the embodiment of FIG. 6 may be desirable in environments with less moisture relative to the embodiment of FIG. 5.

In the illustrated embodiment, the waterproof structure of the present disclosure has one or two grooves, but the present disclosure is not limited to this. Depending on the specific structure design, the waterproof structure of the present disclosure may have more than two grooves. Additionally or alternatively, the grooves may comprise shapes different than the U-shape. In one example, the grooves may comprise a C-shape, a D-shape, a V-shape, and the like. Additionally or alternatively, the groove(s) may comprise a square, a rectangular, or a trapezoidal shape, wherein corners of the groove may be rounded.

The illustrated embodiment shows the specific form of the groove of the waterproof structure of the present disclosure, but the present disclosure is not limited to this. The cross-sectional shape of the groove of the present disclosure may be a square, a rectangle or a trapezoid with rounded corners, or may be a part of a circle or an ellipse.

In a further embodiment of the present disclosure, the electronic device is, for example, a car power amplifier connector and the outer housing is, for example, a car power amplifier housing, but the present disclosure is not limited to this. The electronic device of the present disclosure may be any suitable electronic unit, e.g., a connector of the electronic device or the electronic device itself.

In a further embodiment of the present disclosure, the groove and the inclination of the waterproof structure are formed on the opening upper surface, but the present disclosure is not limited to this. The groove and the inclination of the waterproof structure may be formed on the electronic device housing upper surface.

In a further embodiment of the present disclosure, the gap exists between the electronic device housing upper surface and the opening upper surface, but the present disclosure is not limited to this. The gap of the present disclosure may be between an electronic device housing side surface and an opening side surface, or between an electronic device housing lower surface and an opening lower surface.

Those skilled in the art can understand that, for clear display, the accompanying drawings of the present disclosure are not drawn to scale. In a further embodiment of the present disclosure, the dimension of the gap is between 1 mm and 5 mm. For example, the gap at the left end of the figure may be about 2 mm. The cross-sectional dimension of the groove is between 1 mm and 5 mm; for example, it may be about 2 mm. The cross-sectional dimension of the groove referred to herein may be the largest cross-sectional dimension of the groove, such as the diameter dimension in the case of a circle or the diagonal dimension in the case of a square.

The foregoing descriptions are merely example embodiments adopted to illustrate the principles of the present disclosure, and are not used to limit the protection scope of the present disclosure. For those of ordinary skill in the art, various modifications and improvements can be made without departing from the spirit and essence of the present disclosure, and these modifications and improvements are also within the protection scope of the present disclosure.

The invention claimed is:

1. A waterproof structure for an electronic device, comprising:
   an outer housing having a housing opening; and
   an electronic device housing at least partially mounted in the outer housing through the housing opening,
   wherein the electronic device housing has an electronic device housing surface, the housing opening has an opening surface opposite to the electronic device housing surface, and the electronic device housing surface and the opening surface are spaced apart from an outer end of the opening surface to an inner end of the opening surface to define a gap therebetween, and
   wherein one of the electronic device housing surface and the opening surface defines a longitudinally extending groove, and an opening of the groove is orientated toward the other one of the electronic device housing surface and the opening surface.

2. The waterproof structure for the electronic device according to claim 1, wherein the electronic device housing surface is an upper surface of the electronic device housing, and the opening surface is an opening upper surface of the housing opening.

3. The waterproof structure for the electronic device according to claim 2, wherein the groove is formed in the opening surface and extends along a longitudinal direction of the opening surface, and the opening of the groove is orientated toward the electronic device housing surface.

4. The waterproof structure for the electronic device according to claim 3, wherein the opening surface comprises a first plane portion and a second plane portion, and the groove is formed between the first plane portion and the second plane portion.

5. The waterproof structure for the electronic device according to claim 4, wherein the first plane portion and the second plane portion are inclined with respect to the electronic device housing surface, and wherein a distance between an outer end of the opening surface and the electronic device housing surface is smaller than a distance between an inner end of the opening surface and the electronic device housing surface.

6. The waterproof structure for the electronic device according to claim 5, wherein the first plane portion and the second plane portion are in a plane that is inclined with respect to the electronic device housing surface.

7. The waterproof structure for the electronic device according to claim 5, wherein an inclination angle of the first plane portion and the second plane portion with respect to the electronic device housing surface is between 5 degrees and 15 degrees.

8. The waterproof structure for the electronic device according to claim 4, wherein the first plane portion and the second plane portion are in a plane that is parallel to the electronic device housing surface.

9. The waterproof structure for the electronic device according to claim 3, wherein the groove extends longitudinally over an entire length of the gap.

10. The waterproof structure for the electronic device according to claim 1, wherein a cross-sectional shape of the groove is a square, a rectangle, or a trapezoid with rounded corners.

11. The waterproof structure for the electronic device according to claim 1, wherein a cross-sectional shape of the groove is a part of a circle or an ellipse.

12. The waterproof structure for the electronic device according to claim 1, wherein the electronic device is a vehicle-mounted power amplifier, the electronic device housing is a connector housing of the vehicle-mounted power amplifier, and the connector housing has a connector opening, which is exposed to an external environment through the housing opening.

13. The waterproof structure for the electronic device according to claim 1, wherein the groove is one groove of two or more grooves that are parallel and spaced apart from each other.

14. The waterproof structure for the electronic device according to claim 1, wherein a dimension of the gap is between 1 mm and 5 mm, and a cross-sectional dimension of the groove is between 1 mm and 5 mm.

15. The waterproof structure for the electronic device according to claim 1, wherein a part of the electronic device housing is exposed to an external environment through the housing opening.

16. An electronic device comprising the waterproof structure for the electronic device according to claim 1.

17. A waterproof structure for an electronic device, comprising:
an outer housing having a housing opening; and
an electronic device housing at least partially mounted in the outer housing through the housing opening,
wherein the electronic device housing has an electronic device housing upper surface, the housing opening has an opening upper surface opposite to the electronic device housing upper surface, and the electronic device housing upper surface and the opening upper surface are spaced apart to define a gap therebetween;
wherein a groove is formed in the opening upper surface, the groove extends along a longitudinal direction of the opening upper surface, and an opening of the groove is orientated toward the electronic device housing upper surface;
wherein the opening upper surface comprises a first plane portion and a second plane portion, and the groove is formed between the first plane portion and the second plane portion; and
wherein the first plane portion and the second plane portion are inclined with respect to the electronic device housing upper surface, and a distance between an outer end of the opening upper surface and the electronic device housing upper surface is smaller than a distance between an inner end of the opening upper surface and the electronic device housing upper surface.

18. The waterproof structure for the electronic device according to claim 17, wherein an inclination angle of the first plane portion and the second plane portion with respect to the electronic device housing upper surface is between 5 degrees and 15 degrees.

19. The waterproof structure for the electronic device according to claim 17, wherein the groove extends longitudinally over an entire length of the gap.

20. The waterproof structure for the electronic device according to claim 17, wherein the groove is one groove of two or more grooves that are parallel and spaced apart from each other.

* * * * *